United States Patent [19]

McGinty et al.

[11] Patent Number: 4,588,468
[45] Date of Patent: May 13, 1986

[54] APPARATUS FOR CHANGING AND REPAIRING PRINTED CIRCUIT BOARDS

[75] Inventors: Joseph R. McGinty, Healdsburg, Calif.; Kevin A. Donnelly, Huntsville, Ala.

[73] Assignee: Avco Corporation, Huntsville, Ala.

[21] Appl. No.: 717,202

[22] Filed: Mar. 28, 1985

[51] Int. Cl.⁴ .................. B44C 1/22; B32B 31/00; C23F 1/02; B29C 17/08
[52] U.S. Cl. ................... 156/345; 29/33 M; 29/564.1; 29/874; 156/629; 156/643; 156/901; 156/94; 156/250; 156/272.8; 156/273.3; 156/510; 156/578; 228/180.1
[58] Field of Search ............... 156/627, 629, 634, 643, 156/656, 668, 345, 901, 902, 64, 94, 155, 250, 272.8, 273.3, 378, 379, 379.6, 510, 578; 29/33 K, 33 M, 564.1, 564.4, 564.6, 850, 874; 228/180 R

[56] References Cited

U.S. PATENT DOCUMENTS

| | | | |
|---|---|---|---|
| 3,727,284 | 4/1973 | Ragard et al. | 29/203 B |
| 3,840,962 | 10/1974 | Coller | 29/203 B |
| 4,030,180 | 6/1977 | Pierson | 29/741 |
| 4,079,489 | 3/1978 | Kowalski et al. | 29/33 K |
| 4,271,573 | 6/1981 | von Roesgen | 29/33 M |
| 4,283,836 | 8/1981 | Janisiewicz et al. | 29/564.1 |
| 4,283,847 | 8/1981 | May | 29/832 |
| 4,373,655 | 2/1983 | McKenzie | 228/180 R |
| 4,414,741 | 11/1983 | Holt | 28/837 |
| 4,469,553 | 9/1984 | Whitehead | 156/627 |

Primary Examiner—William A. Powell
Attorney, Agent, or Firm—Robert J. McNair, Jr.; Irwin P. Garfinkle

[57] ABSTRACT

A printed circuit board modification and repair system is presented which functions under computer control. Modification is accomplished by securing the printed circuit board to an X-Y positioning fixture mounted on a work station table. After indexing to a reference point, the X-Y positioning fixture can be moved fore, aft and sideways by computer command to bring a specific location on the printed circuit board under any one of a plurality of heads mounted above the work station surface. One head will contain an etch cutting bit for making cuts in printed circuit connections. A second head has mounted thereon a laser beam discharge device for removing conformal coatings and wire insulation. A third head mounts a wire dispenser for making new conductive paths and a glue dispenser for securing the newly positioned wire to the board. A fourth head contains an ultra-violet lamp for achieving quick cures of glues and epoxy. Solder paste is dispensed from another head and new solder connections made between the wire ends and printed circuit strips by the laser. All operations are controlled by the computer whose commands are sequenced from an operator control console. Programs for modifying or changing various types of printed circuit boards are stored on disks which can be inserted in the disk drive system of the computer.

7 Claims, 11 Drawing Figures

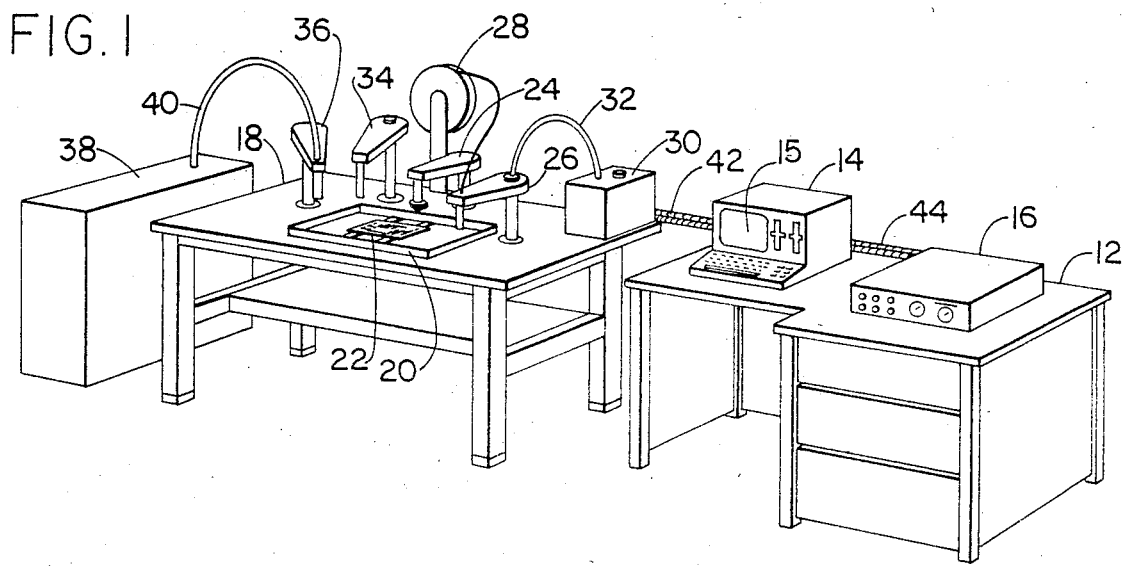
FIG. 1
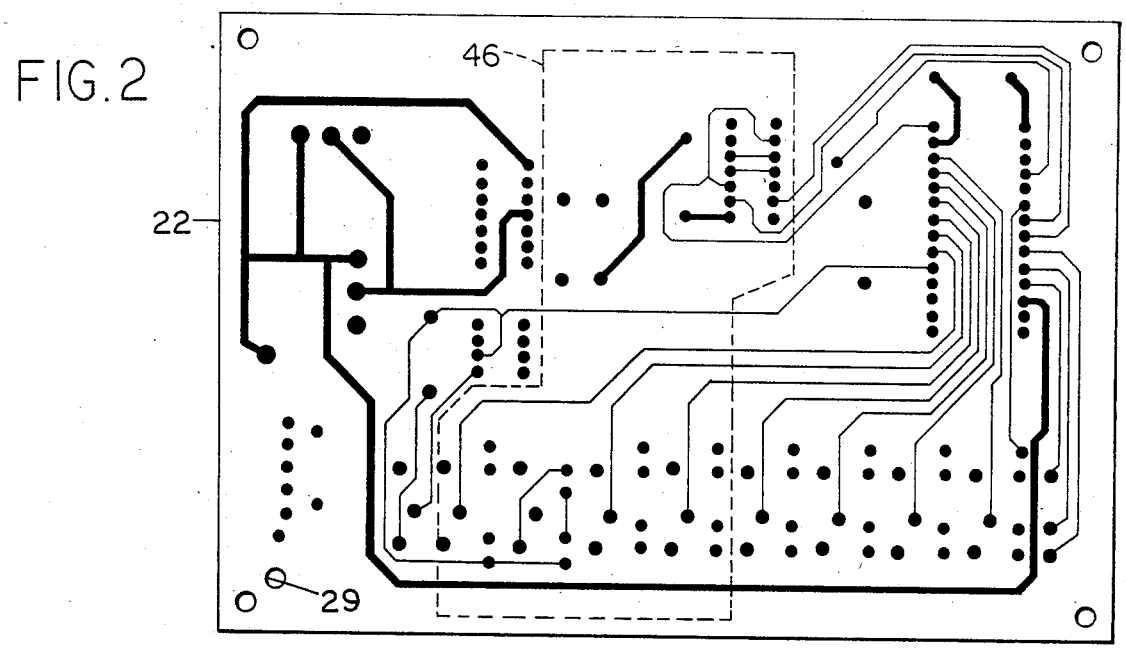
FIG. 2
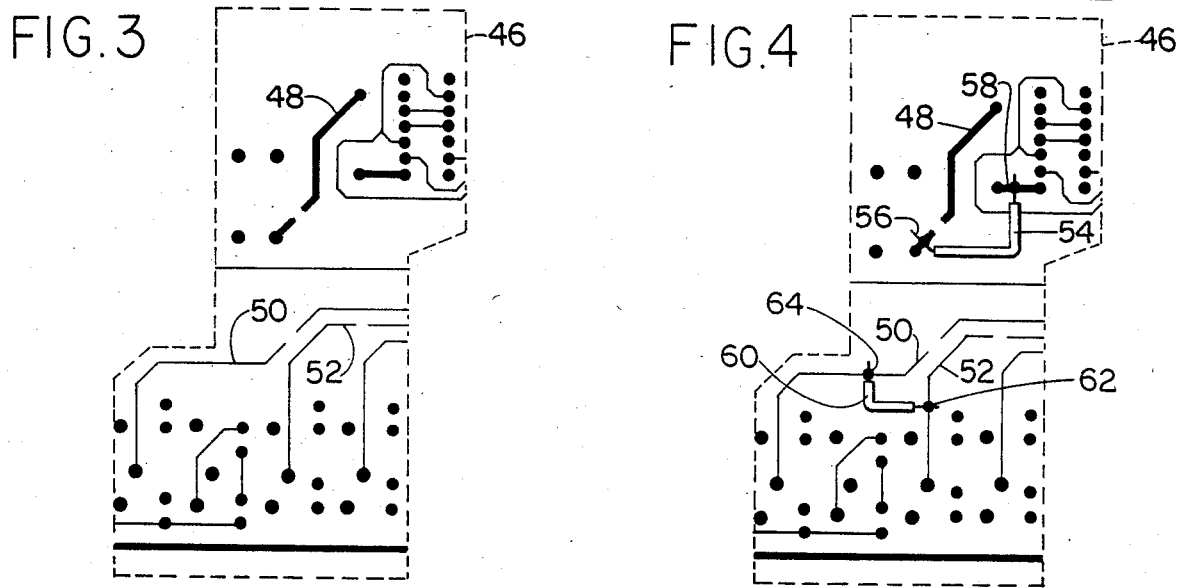
FIG. 3
FIG. 4

APPARATUS FOR CHANGING AND REPAIRING PRINTED CIRCUIT BOARDS

BACKGROUND OF THE INVENTION

This invention relates generally to the repair and modification of printed circuit boards. More specifically, an automated system is presented which allows an operator to program instructions into a keyboard which cause machine operations to be carried out relative to printed circuit boards.

Printed circuit boards may need modification for any one of several reasons. There can be a design deficiency which requires correction. Rework may be desired to accommodate performance of new functions. Engineering change notices may be received specifying that corrective action be taken.

In the prior art, the U.S. Pat. No. 4,469,553 to Whitehead defines a system for manufacturing, changing, repairing and testing printed circuit boards. An automated system is described which guides an operator through each step in a series by sequentially projecting a visual image of what he must do next. This approach is premised on the assumption that it is necessary to assemble, modify, repair and/or test a complex printed circuit board in accordance with a specified schedule. The prior art system of Whitehead includes a work station on which a printed circuit board is fixedly positioned for assembly of components. All components are arranged in a predetermined array situated adjacent the work station. Structure is provided for both visual image and verbal instructions as to how the system operator is to proceed. Each step of the assembly procedure is defined and the precise location identified for placement of the next component selected from the component array.

In implementing engineering change notices Whitehead teaches that a set of visible images and corresponding verbal instructions are to be generated with respect to making new conducting paths between predetermined points on the printed circuit board. The new circuit paths may comprise the addition of lengths of insulated wire between predetermined points on the board. Additionally, the Whitehead apparatus may be used for repair of defective boards by first making tests to find the defective components, then proceeding as though implementing a change notice.

Applicants' apparatus for changing and repairing printed circuit boards does not use the image projection and verbal instruction concept of Whitehead. Rather, automated tools are directed to implement changes at X-Y printed circuit board coordinate locations indexed from a known reference point.

SUMMARY OF THE INVENTION

The present invention comprises apparatus for automatically changing and repairing printed circuit boards under control of a computer. Modification is accomplished by securing the printed circuit board in an X-Y positioning table where the board is indexed to a known reference point. A plurality of swivel stands are mounted around the periphery of the X-Y positioner. Each stand has a head which can be programmed to swing out over the surface of the printed circuit board. One head will contain an etch cutting bit for making cuts in printed circuit connections. A second head has mounted thereon a laser beam discharge device for removing conformal coatings and wire insulation. A third head mounts a wire dispenser for making new conductive paths and a glue dispenser for securing the newly positioned wire to the board. A fourth head contains an ultraviolet lamp for achieving quick cures of glues and epoxy. Solder paste is then dispensed and new solder connections made between the wire ends and printed circuit strips by passing the board under the beam of the laser head. All operations are controlled by a computer whose commands are sequenced from an operator control console. Programs for modifying or changing various types of printed circuit boards are stored on disks which can be inserted in the disk drive system of the computer.

BRIEF DESCRIPTION OF THE DRAWINGS

FIG. 1 is a perspective view of the system for changing and repairing printed circuit boards.

FIG. 2 is a bottom view of a typical printed circuit board which is to be modified.

FIG. 3 is a partial view of the printed circuit board of FIG. 2 showing cuts made in three of the printed circuit conductors.

FIG. 4 is a partial view of the printed circuit board of FIG. 3 after circuit modification by addition of wire conductors.

BRIEF DESCRIPTION OF THE EMBODIMENT

Figure 5:
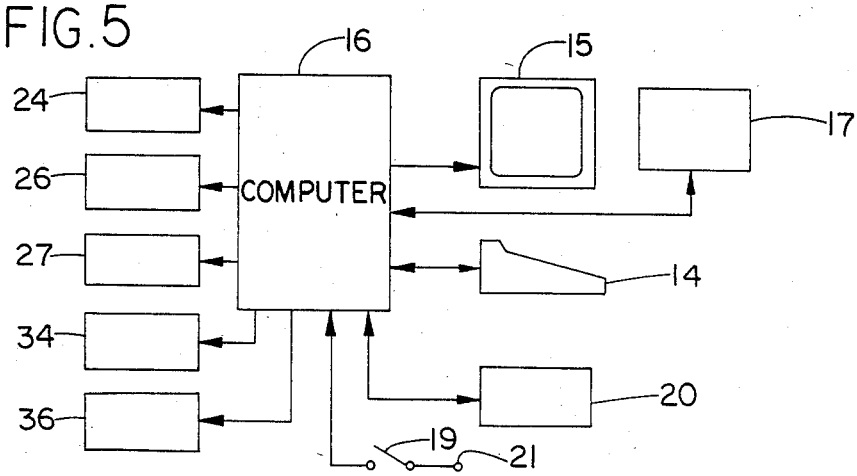
FIG. 5 is a schematic illustration of the apparatus used to change and repair printed circuit boards.

FIG. 1 shows a perspective view of the apparatus used for modifying printed circuit boards. The apparatus includes an operator's desk 12 on which there is a control console 14 having a display screen 15. A microcomputer 16 having a disk drive included therein rests on the desk. The computer controls equipment mounted on table 18. This equipment includes an X-Y positioning fixture 20 on which is mounted a printed circuit board 22. A plurality of swivel stands surround the periphery of the X-Y positioner. Each stand has a head which is computer programmed to swing out over the surface of the printed circuit board 22. Head 24 contains an edge cutting bit for making cuts in the printed circuit connections. Head 26 accomplishes two functions. Firstly, it mounts a wire dispenser using reel 28 as a source. Secondly, it contains a glue dispenser for securing the wire dispensed from reel 28. Canister 30 serves as a storage source for the glue which is delivered to head 26 via flexible tube 32. Head 34 has mounted thereon an ultra violet lamp for achieving quick cures of glues and epoxy compounds. Finally, head 36 has mounted thereon a laser beam discharge device whose pulses are generated in console 38 which is connected to head 36 by means of cable 40. Control and actuation of the equipment on table 18 is achieved by means of cables 42 and 44.

FIG. 2 shows a typical printed circuit board which is to be modified using the equipment of FIG. 1. The desired modification of circuit board 22 is to be accomplished within the dashed line section 46. Modification is accomplished by making cuts in printed circuit sections as shown in FIG. 3. The cuts are made using the etch cutting bit mounted on head 24 as shown in FIG. 1. The cuts are made in foil strips 48, 50 and 52 as shown in FIG. 3. Once these cuts have been made it is desirable to add conductors as shown in FIG. 4. FIG. 4 is a partial section 46 of the printed circuit board 22 shown in FIG. 2. FIG. 4 shows the end result of adding the new conductors 54 and 60 using head 26 as shown in FIG. 1. Conductor 54 makes an electrical connection between points 56 and 58 leaving conductor 48 disconnected from the circuit. Conductor 60 completes the electric circuit between conductors 50 and 52 by making soldered connections at points 62 and 64.

FIG. 5 is a schematic diagram of the apparatus shown in FIG. 1. Operator's control console 14 programs instructions into computer 16. Instructions programmed into the computer 16 are displayed on video tube 15. Prestored instructions for the computer are derived from disk drive system 17. Positioning of the X-Y coordinates of the printed circuit board are established by the drive system of unit 20. Prime power is available to the system from terminal 21 and is activated by switch 19. Actuation of the various drive heads is accomplished by the computer 16 as follows. The etch cutting bit is controlled by head 24. The wire is dispensed from head 26. Glue is dispensed to hold the wire in position by head 27. The glue is quickly cured by head 34. The laser beam is activated by removing board conformal coating and wire insulation by head 36.

Figure 8:
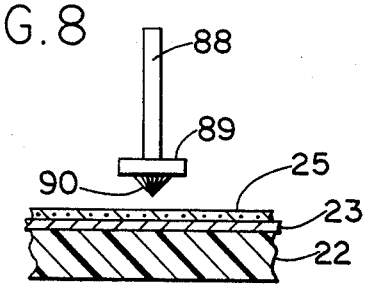
FIG. 8 is a side view of a router bit used for cutting printed circuit foil strip conductors.

In the unit reduced to practice a RS-232 serial interface unit outputs the x and y coordinates to the X-Y positioning fixture 20. Initially the x and y coordinates of the printed circuit board 22 are established by positioning the edge cutting bit of head 24 on index point 29 shown in FIG. 2. A typical edge cutting bit is shown in FIG. 8 where shaft 88 has on its lower end router bit 90. A depth stop 89 is positioned above router bit 90. After being indexed on the printed circuit board, the X-Y positioning fixture can be programmed by the computer to move so that the edge cutting bit is directly above the desired location of the first cut. The edge cutting bit can then be moved downward under computer control to accomplish cutting of the first connector foil. Computer control of the Z-axis movement provides the capability to make cuts on the board surface or below the surface if a multi-layered board is used. This same process is repeated for all cuts which have to be made.

The laser unit in head 36 is next used to remove the solder mask or conformal coating from the copper traces at all connection points where jumper wires are to be added. Using the same indexing established in the previous step, the computer will direct the X-Y positioning fixture 20 to the location where the laser head is directly above the connection point of the first wire. The computer then turns the laser beam on and the solder mask or conformal coating is vaporized. This process is repeated for all connection points.

Figure 6:
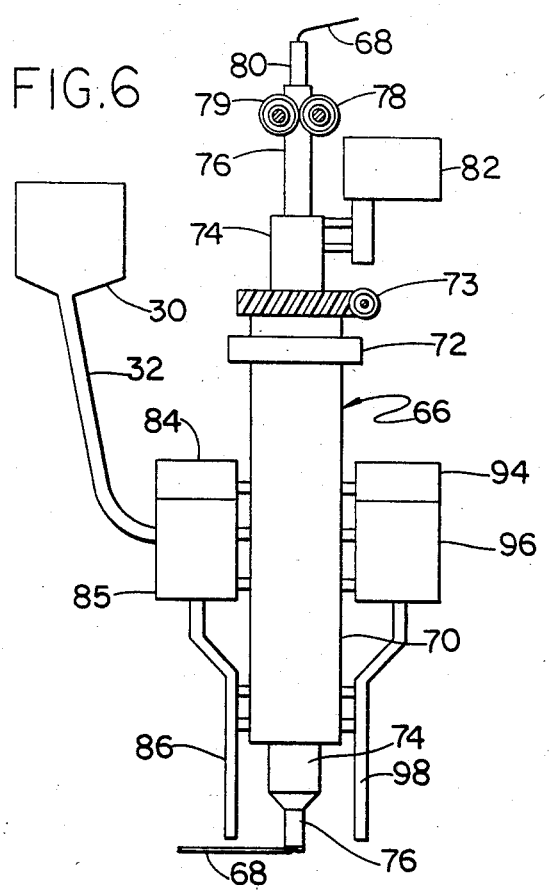
FIG. 6 is a side view of the wire-feed head and the glue dispenser.
Figure 7:
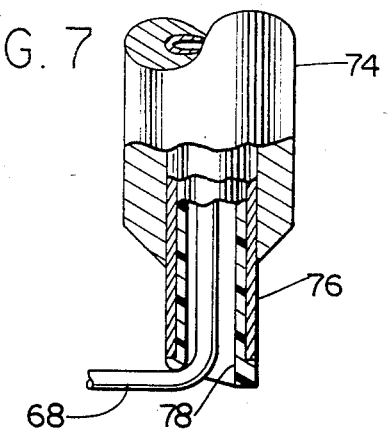
FIG. 7 is an enlarged cross sectional view of the guillotine mechanism used for severing conductor wire dispensed through the FIG. 6 head.

After all cuts have been made and all connection points prepared, the computer next directs the X-Y positioning fixture 20 to move to the location where the wire feed unit shown in FIG. 6 is fixedly mounted to head 26. As shown in FIG. 6, the wire feed unit 66 comprises a glue pivot sleeve 70 attached to the head by means of glue pivot bearing 72. Pivot sleeve 70 is rotated by means of a worm gear drive unit 73. Within pivot sleeve 70 there is a guillotine sleeve 74 which is actuated by guillotine solenoid 82. Within guillotine sleeve 74 there is a hollow wire feed needle 76 having a teflon inner sleeve 80. A pair of wire advance rollers 78 and 79 serve to advance wire 68 downwardly through hollow wire feed needle 76. Mounted on the side of glue pivot sleeve 70 is a glue solenoid 84 which operates a glue pump 85. The glue pump 85 has as its input flexible tube 30 which connects to glue canister 30. The output of glue pump 85 is discharged through glue dispensing needle 86. FIG. 7 shows an enlarged view of the dispensing end of wire feed unit 66. Guillotine sleeve 74 will slide down over hollow wire feed needle 76 to cut off the conductor wire when guillotine solenoid 82 is actuated. The lower end of needle 76 is cut at a slant so that the conductor wire will always exit generally at right angles to the needle when the needle is in close proximity to a printed circuit board.

As shown in FIG. 6 there is a solder paste dispensing mechanism mounted on glue pivot sleeve 70 opposite the glue dispenser. The solder paste dispensing mechanism consists of a solder paste solenoid 94, a solder paste pump and container 96 and a paste dispensing needle 98. It will be understood that with rotation of pivot sleeve 70 by means of worm gear drive unit 73 both the glue dispensing needle 86 and the solder paste dispensing needle 98 can be rotated to any azimuth angle with respect to wire feed needle 76. Thus the positioning of both the glue and the soldering paste can be accurately controlled under the direction of the computer.

After all cuts are made and all connection points prepared, the computer will direct the X-Y positioning table to the location where the wire feed head 66 is directly above the starting point of the first jumper wire. Wire feed head 66 places the wire 68 in contact with the printed circuit board at the starting point. The computer 16 then directs the glue dispenser needle 86 to place a drop of glue on the wire at the point where it makes contact with the printed circuit board. The computer 16 will then turn the ultra violet light 34 on which shines on the drop of glue and cures it within approximately two seconds. This mechanical bonding of the wire to the printed circuit board serves to draw the wire out of the feed head as the printed circuit board is moved in the X-Y positioning fixture 20. The computer 16 directs the X-Y positioning fixture to move the printed circuit board so that wire 68 crosses over the first connection point. Another drop of glue is then dispensed and the ultra violet light again cures it. This holds the wire against the first connection point as the computer 16 directs the X-Y positioning fixture 20 to move the printed circuit board so that the wire is routed along the pre-programmed path to the second connection point. Glue is dispensed along the path of the wire to hold it firmly to the printed circuit board except at the two connection points. The ultra violet light is used to achieve a rapid curing of the glue. After passing the second connection point additional glue is dispensed and cured. The wire is then severed by actuation of guillotine 74. This process is repeated for laying down and attaching all jumper wires.

Figure 9:
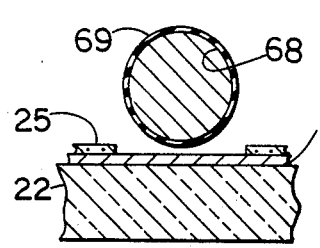
FIG. 9 is a cross sectional view of a newly positioned insulated wire overlaying a printed circuit board.
Figure 10:
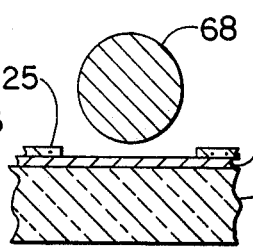
FIG. 10 is a cross sectional view of the FIG. 9 wire after insulation has been removed by a laser.

After all jumper wires are in place on the board, the computer directs the X-Y positioning fixture 20 to the location where the laser head 36 will be directly above the first connection point of the first wire. In cross section, wire 68 will appear as shown in FIG. 9. The laser beam is then turned on and the insulation coating 69 will be vaporized at the connection point. In FIG. 9 the printed circuit board 22 has attached to its surface a conductive foil 23 which is covered by a conformal coating layer 25. After turning on the laser beam, both the insulation coating 69 and the conformal coating 25 will be vaporized resulting in the situation shown in FIG. 10. This vaporization of wire insulation will be repeated for all connection points.

Figure 11:
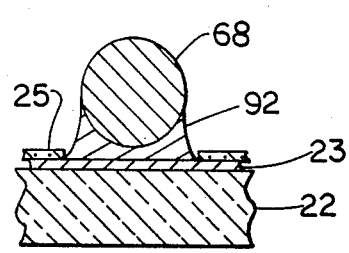
FIG. 11 is a cross sectional view of the FIG. 10 wire after application of solder to join the newly formed conductive path.

After the wire insulation has been removed at all connection points, computer 16 directs the X-Y positioning table to move to the place where the solder paste dispenser attached to the side of the glue pivot sleeve 70 (shown in FIG. 6) is directly above the first connection point. The solder paste dispenser comprises a dispensing solenoid 94, a solder paste pump and container 96 and a solder dispensing needle 98. The computer 16 directs the dispensing of a drop of solder paste on the first connection point using the RS-232 serial interface unit. This process is repeated for the dispensing of solder paste at all connection points. The computer then directs the X-Y positioning fixture to move to the location where the laser head is directly above the first connection point. The computer 16 turns the laser on to a high mode and the solder paste flows to form a soldered connection 92 between the exposed copper trace 23 and the exposed copper wire 68 (see FIG. 11). This soldering process is completed for all connection points.

The modified printed circuit board is now removed from the fixture and appropriate components installed. The printed circuit board is then passed through a wave soldering machine. If the jumper wires were placed on the bottom side of the board, the solder at the wire connection points reflows maintaining a soldered connection. In the system reduced to practice, a heavy armored polythermaleze insulated wire was used. This type of insulation is able to withstand processing in a wave soldering machine. The glue used is also specially formulated to withstand the temperatures present in a wave soldering machine.

Although a particular embodiment of the invention has been illustrated and described, it will be understood that the invention is not limited to a single embodiment. A different complement of swivel heads can be used or all heads can be fixedly positioned and the X-Y positioning fixture moved from one station to the next as needed. The particular invention covered by this specification and claims is directed to a fully automated system for changing and repairing printed circuit boards. Accomplishing the task under computer control substantially eliminates errors when changing or modifying a large number of boards.

Various modifications will be apparent to those skilled in the art. Therefore, the invention should not be limited to the specific arrangement illustrated but only by the following claims.

We claim:

1. Apparatus for changing and repairing printed circuit boards having a plurality of foil strip conductors etched thereon, the plurality of conductors being conformal coated for protection, each conductor terminating at a pad capable of receiving electronic circuit components, the apparatus comprising:

work station means including an X-Y positioning fixture for mounting and retaining a printed circuit board, motion of said positioning fixture being relative to said work station means thereby providing indexing of a point on the surface of said printed circuit boards;

cutting means for making cuts in said foil strip conductors at predetermined locations;

laser beam discharge means for removing solder masks and conformal coatings from the foil strip conductors of said printed circuit board at predetermined points;

wire dispensing means for forming and mechanically bonding jumper wires between a plurality of first and second connection points on said printed circuit board;

wire insulation removal means at locations where jumper wires cross over connection points;

solder means for electrically encircuiting said jumper wires with the foil strip conductors of said printed circuit board;

a computer including a memory, said computer having means for generating commands in accordance with programmed instructions for actuating, sequencing and directing said complement of work station, cutting, laser beam discharge, wire dispensing, wire insulation removal and solder means for accomplishing electric circuit modification of said printed circuit board; and a control console coupled to said computer for inserting programmed instructions therein.

2. Apparatus for changing and repairing printed circuit boards as defined in claim 1 wherein the wire dispensing means for forming and mechanically bonding jumper wires includes a wire feed head for placing a jumper wire between first and second connection points on said printed circuit board, a glue dispenser for applying glue between said jumper wire and said board, an ultra violet lamp for quick curing of said glue and means for severing said jumper wire after a prescribed length has been dispensed.

3. Apparatus for changing and repairing printed circuit boards as defined in claim 1 wherein the computer includes a disk drive system for storage of programmed instructions.

4. The invention as defined in claim 1 wherein the control console includes a video display tube for presenting data to an operator as instructions are being programmed into said computer.

5. Apparatus as defined in claim 1 wherein all actions resulting from computer generated commands are accomplished using heads arrayed above said work station, one head having mounted thereon a cutting bit for making cuts in printed circuit connections, a second head having mounted thereon a laser beam discharge device, a third head mounting a wire dispenser, a glue dispenser and a solder paste dispenser, and a fourth head mounting an ultra-violet lamp for achieving quick curing of glue.

6. The apparatus as defined in claim 5 wherein said work station is a table.

7. The apparatus as defined in claim 5 wherein each of said heads is mounted on swivel stand.

* * * * *